United States Patent [19]

Collins

[11] Patent Number: 4,777,387
[45] Date of Patent: Oct. 11, 1988

[54] FAST TURN-OFF CIRCUIT FOR PHOTOVOLTAIC DRIVEN MOSFET

[75] Inventor: Howard W. Collins, Santa Ana, Calif.

[73] Assignee: International Rectifier Corporation, Los Angeles, Calif.

[21] Appl. No.: 581,784

[22] Filed: Feb. 21, 1984

[51] Int. Cl.$^4$ .............. H03K 3/01; H03K 17/687; H03K 5/00; G06B 27/00
[52] U.S. Cl. .................. 307/270; 307/570; 307/571; 307/311; 307/549; 250/551
[58] Field of Search .............. 307/311, 270, 570–581; 250/551

[56] References Cited

U.S. PATENT DOCUMENTS

| | | | |
|---|---|---|---|
| 3,378,700 | 4/1968 | Stewart | 307/311 |
| 3,486,821 | 12/1969 | Westhaver | 307/311 |
| 3,987,319 | 10/1976 | Nirschl | 307/580 |
| 4,227,098 | 10/1980 | Brown et al. | 307/311 |
| 4,303,831 | 12/1981 | El Hamamsy | 250/551 |
| 4,307,298 | 12/1981 | El Hamamsy et al. | 250/551 |
| 4,390,790 | 6/1983 | Rodriquez | 307/311 |
| 4,419,586 | 12/1983 | Phipps | 307/311 |
| 4,423,341 | 12/1983 | Shelly | 307/570 |
| 4,438,356 | 3/1984 | Fleischer | 307/577 |
| 4,461,566 | 7/1984 | Hebenstreit | 307/571 |
| 4,481,434 | 11/1984 | Janutka | 307/570 |
| 4,485,311 | 11/1984 | Goerne et al. | 307/311 |
| 4,492,883 | 1/1985 | Janutka | 307/571 |
| 4,500,801 | 2/1985 | Janutka | 307/570 |

OTHER PUBLICATIONS

Solid-State Relay Outperforms Reeds for Small Analog Signals "Electronic Design", Mar. 8, 1984; pp. 1-6.

Primary Examiner—Stanley D. Miller
Assistant Examiner—B. P. Davis
Attorney, Agent, or Firm—Ostrolenk, Faber, Gerb & Soffen

[57] ABSTRACT

A power MOSFET is controlled by illuminating a single photovoltaic generator which produces an output current which charges the gate capacitanace of the power MOSFET to turn on the device. A sensing impedance which may be a diode, MOSFET or other component is connected between the photovoltaic generator and the gate of the power MOSFET. The sensing impedance in the disclosed embodiment is a diode. The sensing impedance forces the power MOSFET gate voltage instantaneously to follow the photovoltaic generator output voltage. The diode is connected in series with the charging circuit and a switching transistor is connected in parallel with the gate capacitance of the MOSFET. The switching transistior base is coupled to the output of the photovoltaic source so that, when the photovoltaic source turns off, and the voltage of the photovoltaic source decays below a predetermined value, the switching transistor turns on to short-circuit the MOSFET gate capacitance so that it can immediately discharge to provide fast turn-off of the power MOSFET. A dV/dt clamping circuit is provided to prevent false charging of the power MOSFET gate through its drain-to-gate capacitance.

24 Claims, 1 Drawing Sheet

FAST TURN-OFF CIRCUIT FOR PHOTOVOLTAIC DRIVEN MOSFET

RELATED APPLICATIONS

This application is related to co-pending application Ser. No. 477,012, filed Mar. 21, 1983, in the name of Daniel M. Kinzer, entitled "Photovoltaic Isolator and Process of Manufacture Thereof", and assigned to the assignee of the present application, as well as to application Ser. No. 581,785, filed Feb. 21, 1984, in the name of Daniel M. Kinzer, entitled "Bidirectional Output Semiconductor Field Effect Transistor and Method for its Manufacture" and assigned to the assignee of the present application.

BACKGROUND OF THE INVENTION

This invention relates to a solid state relay circuit, and more specifically relates to a solid state relay circuit employing a power MOSFET as the main switching device and having extremely rapid turn-on and turn-off capability when driven from the output of a single input voltage source.

Solid state relay circuits are well known wherein a power MOSFET or other switching transistor is used as the main power switching device. Such relays are also known wherein the input energy for switching the transistor is derived from a photovoltaic generator which can be illuminated by a suitable LED or other radiation source in order to produce an output current which causes the switching of the device. Such a relay is shown in U.S. Pat. No. 4,227,098.

When the main power switching device is a power MOSFET, the input current from the photovoltaic source must charge the gate capacitance of the device sufficiently in order to turn the device on. When using photovoltaic generators, commonly a stack of solar cell-type devices, such generators must operate into a high impedance to prevent the diversion of the cell output current away from the MOSFET gate capacitance. The need for a high impedance delays the discharge of the gate capacitance when the input radiation signal to the photo-generator is turned off and the photogenerator output voltage collapses. Thus, in the circuit of Patent 4,227,098, the main power MOSFET remains on after the input signal terminates for the length of time necessary to discharge the gate capacitance of the power MOSFET into a high impedance circuit. The circuit of Patent 4,227,098 is also sensitive to false firing due to high dV/dt across the power MOSFET terminals since the high dV/dt will charge the drain-to-gate capacitance of the power MOSFET and turn on the relay without an input signal.

Circuits are known to cause more rapid discharge of this gate capacitance for high speed turn-off. Such circuits, however, employ a second photovoltaic source, as is shown in U.S. Pat. No. 4,390,790. The second photovoltaic source or array is used to sense the presence or absence of an input signal and turns on a depletion mode MOSFET when the input illumination is turned off with the turn-off of the input signal. The MOSFET gate capacitance can then discharge more quickly through the conducting depletion mode MOSFET for higher relay turn-off speed.

BRIEF SUMMARY OF THE INVENTION

In accordance with the present invention, a novel circuit is provided to insure that the gate voltage always instantaneously follows a single photovoltaic generator output. There are two conditions which tend to make the power MOSFET gate voltage deviate from the intended photovoltaic generator output. These are the charge stored on the gate to source capacitance $C_{ISS}$ and the current which can flow under high dV/dt through the drain-to-gate capacitance $C_{D-G}$, which falsely charges the gate. It has been recognized that when the power MOSFET gate is connected directly to the photovoltaic generator, it is impossible to distinguish whether a gate signal is properly present from an output of the photogenerator or as a result of the charging of one of the parasitic capacitances $C_{ISS}$ or $C_{D-G}$.

In accordance with one aspect of the invention, a sensing impedance is connected between the photogenerator and power MOSFET gate which can be used to control auxiliary circuits to quickly eliminate false MOSFET gate voltages. In the preferred embodiment, the sensing impedance is a diode, although other components such as a zener diode, MOSFET, or resistor could be used. By using a separate sensing impedance, it becomes possible to control the auxiliary circuits without the need for a second photogenerator array or pile to enable rapid discharge of the capacitance $C_{ISS}$ when the input signal is turned off.

In the preferred embodiment of the invention, the charging circuit from the photovoltaic source output to the gate-to-source circuit of the power MOSFET has a diode connected therein which permits current flow from the photovoltaic source into the gate capacitance and serves as the sensing impedance. A switching transistor circuit is connected in parallel with the gate capacitance $C_{ISS}$ of the power MOSFET device and is controlled from an input control terminal connected to the positive output terminal of the photovoltaic source, so that the switching transistor is biased on when the photovoltaic source output voltage begins to collapse. Consequently, the relay will switch on as soon as sufficient current is generated from the photovoltaic source to charge the gate capacitance of the power MOSFET to the necessary value. When, however, the circuit is to be turned off, and when the output voltage of the photovoltaic source reduces below a given value, the switching transistor turns on to place a short circuit across both the gate capacitance of the power MOSFET and across the photovoltaic source, so that both the gate capacitance $C_{ISS}$ and the output of the photovoltaic source is short-circuited by the switching transistor. Therefore, the power MOSFET rapidly turns off.

A novel dynamic a-c clamping circuit is also provided which includes a further switching transistor connected across the gate-to-source electrodes of the power MOSFET. A resistance-capacitance differentiating circuit is also provided and is connected for turning on the second switching transistor to bypass the Miller current through the gate-to-drain parasitic capacitance $C_{D-G}$ of the power MOSFET when the dV/dt exceeds a given value. Note that this a-c circuit is connected between the sensing impedance referred to above and the power MOSFET gate electrode.

DETAILED DESCRIPTION OF INVENTION

Figure 1:
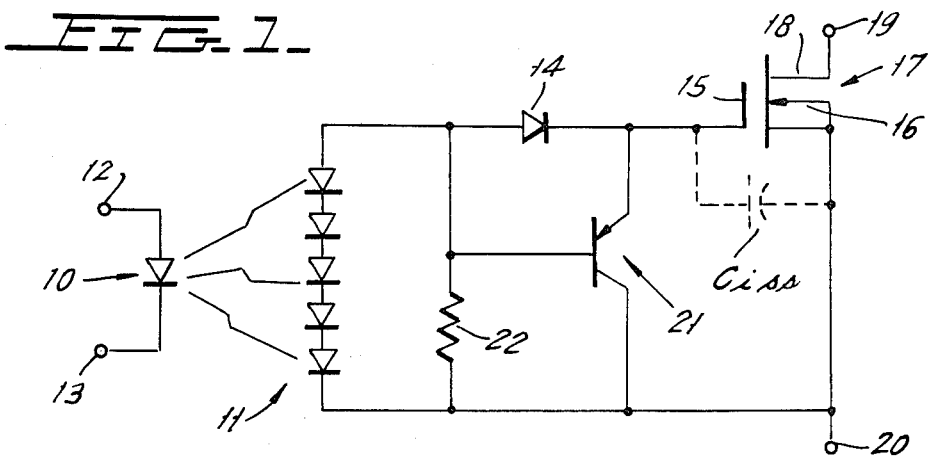
FIG. 1 shows a first embodiment of the novel relay circuit of the present invention.

Referring first to FIG. 1, there is illustrated therein a relay circuit employing some novel features of the invention. Thus, there is provided a photoisolator circuit including an LED 10 and photovoltaic stack 11. When a suitable input voltage is applied to terminals 12 and 13 of LED 10, radiation is applied to the photovoltaic stack 11 and produces an output current. The photovoltaic initiator consisting of LED 10 and stack 11 can take any desired form and could employ various kinds of radiation inputs to generate the output current from the stack 11. The photoisolator 10-11 may take the form of the photoisolator described in co-pending application Ser. No. 477,012, filed Mar. 21, 1983, described above.

The output of the photovoltaic stack 11 is connected in series with diode 14 and the gate electrode 15 and source electrode 16 of the power MOSFET device 17. In accordance with an important aspect of the invention, diode 14 acts as an impedance element connected between device 11 and gate 15. Other impedance elements, such as zener diodes, MOSFETS or resistors could also be used. Drain electrode 18 of power MOSFET device 17 and its gate electrode 16 are coupled to relay output terminals 19 and 20, respectively.

The power MOSFET 17 has a gate capacitance $C_{ISS}$ which must be charged to turn on the device. The power MOSFET 17 could be a HEXFET MOSFET of the type manufactured by the International Rectifier Corporation, of El Segundo, Calif., although any power MOSFET could be employed in the circuit. For example, the MOSFET could be a part of a power integrated circuit MOSFET of the type shown in above-mentioned copending application Ser. No. 581,785.

A switching transistor 21 is connected in parallel with the gate capacitance $C_{ISS}$. The base electrode of transistor 21 is connected to the node between the photovoltaic generator 11 and the diode 14. Resistor 22 is connected between the base and collector of transistor 21.

The operation of the circuit of FIG. 1 is as follows: If it is desired to turn on the circuit connected between output terminals 19 and 20, the LED 10 is energized by a suitable input signal voltage connected to terminals 12 and 13. The LED 10 will then illuminate the junctions in photovoltaic stack 11. Stack 11 then generates an output current which flows in the forward direction of diode 14 and rapidly charges the gate capacitance $C_{ISS}$ to rapidly to turn on the power MOSFET 17. The MOSFET 17 will remain on as long as the photovoltaic stack 11 is illuminated by LED 10.

In order to turn the device 17 off, the LED 10 is deenergized. The output voltage of the photovoltaic stack 11 then begins to collapse. This output voltage normally collapses at a moderate rate, but the charge on capacitance $C_{ISS}$ shows the rate of decay so that the MOSFET 17 normally remains on for a relatively long time after turning off the input signal. In accordance with the present invention, however, once the output voltage of the stack 11 decreases below a given value, the transistor 21 is turned on to provide a low impedance circuit directly across capacitance $C_{ISS}$. Note that transistor 21 is selected such that the transistor will turn on whenever the voltage of the photovoltaic device 11 falls significantly (i.e. 0.6 volt) below the voltage of the capacitance $C_{ISS}$. Consequently, the capacitor $C_{ISS}$ will rapidly discharge and the power MOSFET 17 will quickly turn off.

The circuit of FIG. 1 can be implemented from discrete elements, if desired. The circuit can also be implemented monolithically with the components 14, 21 and 17 formed within a common chip. By way of example, the circuit can be monolithically implemented in the manner shown in co-pending application Ser. No. 581,785, filed Feb. 21, 1984, where the power MOSFET 17 is implemented as a bi-directional output MOSFET device.

Figure 2:
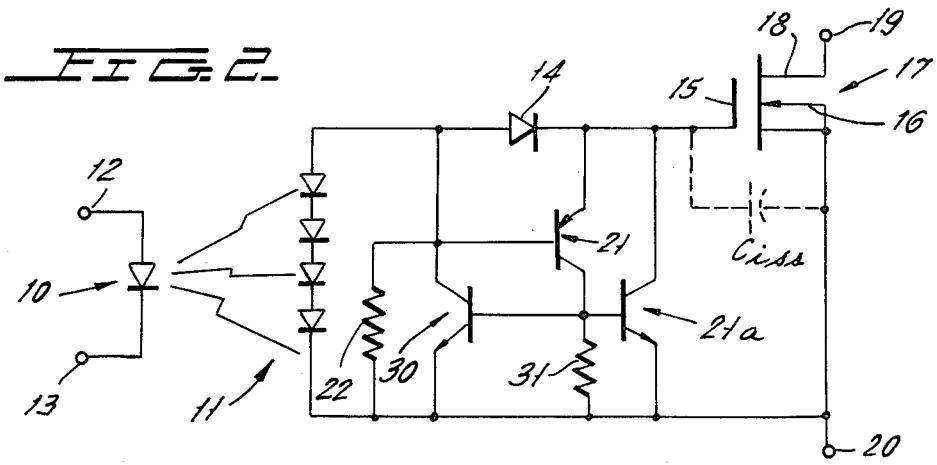
FIG. 2 shows a second embodiment of the circuit of the invention, wherein a second transistor is added to speed the decay time of the photogenerator device and a third transistor is added to increase gain to provide a lower impedance short on the MOSFET gate of the transistor switching circuit.

FIG. 2 shows a second embodiment of the circuit of the invention, wherein components identical to those of FIG. 1 have been given the same identifying numeral. FIG. 2 shows an additional transistor 30 and resistor 31 added to the circuit with the collector-emitter circuit of transistor 30 connected directly across the photovoltaic stack 11, and its base circuit connected to the node between the collector of transistor 21 and resistor 31. Transistor 21a is also added to provide two stages of gain for the discharge of gate capacitance $C_{ISS}$. The circuit of FIG. 2 will operate in the manner described in connection with the circuit of FIG. 1, except that the discharge pulse of the capacitance $C_{ISS}$ will operate to turn on the transistor 30 which, in turn, will cause the voltage of the photovoltaic stack 11 to immediately collapse independently of the normal on-state input impedance, thereby further accelerating the rate of turn-off. PNP transistor 21 also acts to suppress false turn-on by a high dV/dt between terminals 19 and 20, as will be later described.

Figure 3:
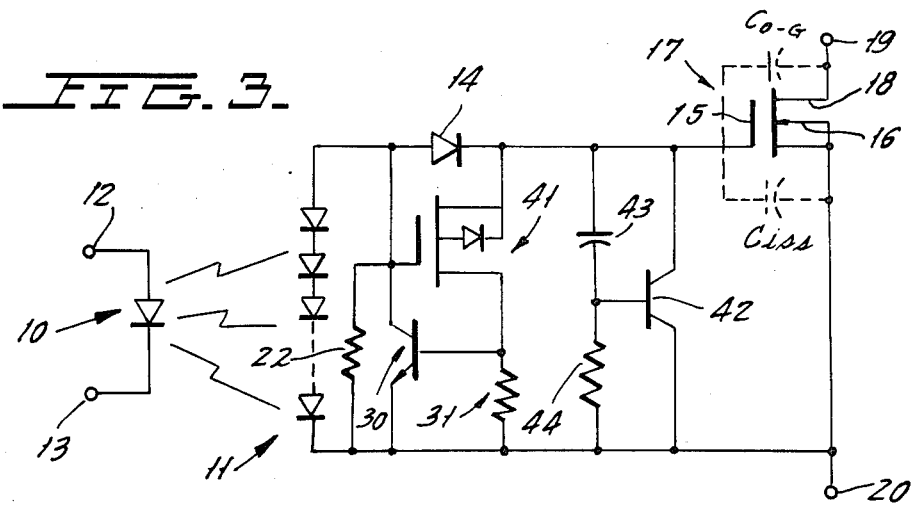
FIG. 3 shows a third embodiment of the circuit of the invention, wherein a MOSFET device in a regenerative circuit is used in place of the switching transistor of FIGS. 1 and 2 and a dynamic a-c clamp is added to prevent false turn-on due to high dV/dt.

FIG. 3 shows a third embodiment of the invention and components having the same numerals as those of FIGS. 1 and 2 have the same function as described in FIGS. 1 and 2. In FIG. 3, transistor 21 is replaced by a P-channel MOSFET 41 and acts as a regenerative turn-off circuit to pull down the voltage of stack 11 when the stack voltage drops below the gate voltage of transistor 41 which is about 0.6 volt. At that point, transistor 41 turns on and the charge on capacitor $C_{ISS}$ discharges through the transistor 41 and the base emitter circuit of transistor 30. This turns on the NPN transistor 30 to discharge stack 11 and keeps MOSFET 41 on during the discharge process.

FIG. 3 also shows the parasitic drain-to-gate capacitance $C_{D-G}$ of MOSFET 17 and a dV/dt control circuit for preventing false turn-on by dV/dt between terminals 19 and 20 which is high enough to charge the gate capacitance $C_{D-G}$ sufficiently to turn on MOSFET 17. Thus, if the MOSFET 17 is off, a large dV/dt appears, the Miller current through capacitor $C_{D-G}$ will cause the gate voltage of gate 15 to rise. This current can be shorted to ground when the gate voltage reaches the threshold voltage of PNP transistor 21 (FIG. 2), or MOSFET 41 (FIG. 3). However, the transconductance, or gain, at that point is such that PNP transistor 21 or MOSFET 41 turns on only to a small current level, of possibly 100 microamperes. At high dV/dt, however, the Miller current can be several milliamperes so that a more effective clamp is needed. A dynamic a-c clamp circuit is provided in FIG. 3 consisting of transistor 42, capacitor 43 and resistor 44. Typically, capacitor 43 may be 20 picofarads and resistor 44 may be 1 megohm.

The resistance-capacitance circuit 43-44 differentiates an applied dV/dt and, at a certain dynamic rate, takes over the function of MOSFET 41 and its associated components and holds transistor 42 shorted across the gate 15 so that false turn-on by high dV/dt cannot occur.

In the circuit of FIG. 3, there is a d-c clamp circuit operating in conjunction with an a-c (dynamic) clamp circuit to suppress the effects of two parasitic capacitances $C_{ISS}$ and $C_{D-G}$ of a MOSFET. Note that all of the components of the circuits of FIGS. 2 and 3 could be implemented monolithically or could be constructed of discrete components. In the foregoing, the MOSFET transistors have been described with reference to specified source and drain electrodes. The source and drain electrode terminology can be interchanged, if desired.

Although the present invention has been described in connection with a number of preferred embodiments thereof, many variations and modifications will now become apparent to those skilled in the art. It is preferred, therefore, that the present invention be limited not by the specific disclosure herein, but only by the appended claims.

What is claimed is:

1. A solid state relay circuit comprising, in combination:
   a photovoltaic initiator circuit comprising an electrically energizable radiation source and an associated photovoltaic generator means; said photovoltaic initiator circuit having first and second terminals connected to said energizable radiation source for producing an output current from said photovoltaic generator means in response to the application thereto of radiation from said radiation source;
   an output metal oxide semiconductor field effect transistor having drain, source and gate electrodes; said output transistor having a gate-to-source capacitance which is charged to turn on said output transistor and is discharged to turn off said output transistor; said drain and source electrodes being connected to an output circuit;
   a transistor switching means having first and second electrodes and a switching electrode; said first and second switching transistor electrodes connected to said gate and source electrodes, respectively, of said output transistor; said switching electrode connected to said first terminal of said photovoltaic generator means; said second terminal of said photovoltaic generator means connected to said source electrode of said output transistor, the application of a voltage less than a given value to said switching electrode relative to said first electrode causing said transistor switching means to switch from a non-conducting to a conducting condition; and
   a sensing impedance means connected between said first terminal of said photovoltaic generator means and said gate electrode of said output transistor and being for detecting any voltage difference therebetween and for biasing off said switching transistor means only so long as said voltage difference exceeds a predetermined value;
   whereby, when said photovoltaic generator means produces an output signal current, said output signal current flows through said sensing impedance means to charge said capacitance and turn on said output transistor and keeps said transistor switching means off, and whereby when said photovoltaic generator is turned off, said switching electrode causes said transistor switching means to switch to its said conducting condition to rapidly discharge said capacitance to cause said output transistor to rapidly turn off.

2. The relay of claim 1 in which said radiation source is a light emitting diode.

3. The relay of claim 1, wherein said output transistor is a vertical conduction mode power transistor having an inherent diode connected across said source and drain electrodes.

4. The relay of claim 1, wherin said sensing impedance means is a unidirectional conduction semiconductor device which is poled to permit flow of charging current from said photovoltaic generator and into said gate-to-source capacitance.

5. The relay of claim 4, wherein said sensing impedance means is a diode.

6. The relay of claim 1, wherein said transistor switching means comprises a second metal oxide semiconductor transistor.

7. The relay of claim 1, wherein said transistor switching means comprises a bipolar transistor.

8. The relay of claim 2, wherein said output transistor is a vertical conduction mode power transistor having an inherent diode connected acros said source and drain electrodes.

9. The relay of claim 8, wherein said sensing impedance means is a diode.

10. The relay of claim 9, wherein said transistor switching means comprises a bipolar transistor.

11. The relay of claim 1 which further includes a second transistor switching means having emitter, collector and base electrodes; said emitter and collector electrodes connected to the opposite terminals, respectively, of said photovoltaic generator means; said base electrode of said second transistor switching means connected to said second electrode of said transistor switching means.

12. The relay of claim 10 which furtheer includes a second transistor switching means having emiter, collector and base electrodes; said emitter and collector electrodes connected to the opposite terminals, respectively, of said photovoltaic generator means; said base electrode of said second transistor switching means connected to said second electrode of said transistor switching means.

13. The relay of claim 6 which further includes a second transistor switching means having emitter, collector and base electrodes; said emitter and collector electrodes connected to the opposite terminals, respectively of said photovoltaic generator means; said base electrode of said second transistor switching means connected to said second electrode of said transistor switching means.

14. The process of turning on and off a metal oxide semiconductor field effect transistor, comprising the step of: injecting a current from a photovoltaic source into the gate-to-source capacitance of said transistor through a diode whch prevents the discharge of said capacitance, thereby to charge said capacitance and rapidly turn on said transistor while preventing the discharge of said capacitance so long as the voltage of said photovoltaic source exceeds a predetermined value; and discharging said gate capacitance through a switching circuit which bypasses said diode with the voltage on said diode falls below the inherent potential of said diode in response to the voltage of said photovoltaic source falling below a given value to thereby rapidly turn off said transistor.

15. A switching circuit for rapidly switching on and rapidly switching off a power metal oxide semiconductor field effect transistor; said power transistor having drain, source and gate electrodes; said switching circuit including an input unidirectional voltage source having first and second terminals switchable between a high and low input voltage, a diode means and a switching transistor having first and second electrodes and a control electrode; the application of a voltage less than a given value to said control electrode relative to said first electrode of said switching transistor causing said switching transistor to switch from a non-conducting to a conducting condition; said first and second terminals of said voltage source, said diode means and said gate and source electrodes of said power transistor connected in closed series relation with a polarity whereby current from said voltage source can flow through said diode means to charge the gate capacitance of said power transistor when said voltage source is switched to said high voltage; said first and second electrodes of said switching transistor connected to said gate and source electrodes, respectively, of said power transistor; said control electrode connected to said first terminal of said voltage source such that said diode means is connected between said control and first electrodes of said switching transistor; said diode means being poled in a direction to bias off said switching transistor only so long as any voltage across said diode means exceeds the threshold potential of said diode means, whereby said switching transistor is switched on to define a discharge path across said gate capacitance in response to the voltage of said voltage source falling from said high voltage to said low voltage.

16. The relay of claim 1, 2, 3, 4, 5, 6, 7 or 11 which further includes a dynamic clamping circuit connected between said gate and source electrodes of said output transistor; said dynamic clamping circuit being operable to bypass the Miller current in the parasitic drain-to-gate capacitor of said output transistor when the dV/dt of a voltage between said drain and source electrodes exceeds a given value.

17. The relay of claim 16, wherein said dynamic clamping circuit includes a series-connected resistor and capacitor and a transistor connected in parallel with said resistor and capacitor; said transistor having a control electrode connected to the node between said resistor and capacitor.

18. The relay of claim 1 which further includes regenerative circuit means coupled to said transistor switching means for discharging both said capacitance and said photovoltaic generator means during turn-off.

19. The relay of claim 18, wherein said regenerative circuit means includes second transistor switching means having first and second main electrodes and a control electrode; said first and second main electrodes of said control transistor switching means connected directly to said first and second terminals of said photovoltaic initiator circuit; said control electrode of said second transistor switching means connected to said source electrode of said output transistor.

20. A solid statee relay circuit comprising, in combination:
a photovoltaic initiator circuit comprising an electrically energizeable radiation source and an associated photovoltaic generator means, said photovoltaic initiator circuit having first and second terminals connected to said energizeable radiation source for producing an output current from said photovoltaic generator means in response to the application thereto of radiation from said radiation source;
an output metal oxide semiconductor field effect transistor having gate and substrate electrodes; and output transistor haivng a gate-to-source capacitance which is charged to turn on said output transistor and is discharged to turn off said output transistor; said electrically energizeable radiation source comprising a light emitting diode; said output transistor comprising a vertical conduction mode power transistor including a sourcer and a drain and having an inherent diode connected across said source and said drain;
a semiconductor device switching means having a pair of main electrodes and a switching electrode; said pair of main electrodes connected to said gate and substrate electrodes, respectively, of said output transistor; said switching electrode coupled to one of said first and second terminals of said photovoltaic generator means, the application of a voltage less than a given magnitude to said switching electrode causing said semiconductor device switching means to switch from a non-conducting to a conducting condition; said semiconductor device switching electrode comprisng a bipolar device; and
a sensing impedance means connected in closed series circuit with said photovoltaic initiator and said gate and substrate electrodes of said field effect transistor and being for biasing off said semiconductor device switching means only so long as said output transistor is in a on-state or is being turned on; said sensing impedance means including a p-n junction;
whereby, when said photovoltaic generator means produces an output signal current, said output signal current flows through said sensing impedance means to charge said capacitance and turn on said output transistor and keeps said semiconductor device switching means off, and whereby when said photovoltaic generator is turned off, said switching electrode causes said semiconductor device switching means to switch to its said conducting condition to rapidly discharge said capacitance to cause said output transistor to rapidly turn off.

21. The relay of claim 20, wherein sid sensing impedance means is a unidirectional conduction semiconductor device which is poled to permit flow of charging current from said photovoltaic generator and into said gate-to-source capacitance.

22. The relay of claim 21, wherein said sensing impedance means in a diode.

23. The relay of claim 20, wherein said transistor switching means comprises a second metal oxide semiconductor transistor.

24. The relay of claim 21, which further includes a second transistor switching means having emitter, collector and base electrodes; said emitter and collector electrodes connected to the opposite terminals, respectively, of said photovoltaic generator means; said base electrode of said second transistor switching means connected to said second electrode of said transistor switching means

* * * * *